United States Patent
Lin et al.

(10) Patent No.: US 7,796,454 B2
(45) Date of Patent: Sep. 14, 2010

(54) SENSING CIRCUIT OF A PHASE CHANGE MEMORY AND SENSING METHOD THEREOF

(75) Inventors: Lieh-Chiu Lin, Kaohsiung (TW); Shyh-Shyuan Sheu, Taichung (TW); Pei-Chia Chiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 168 days.

(21) Appl. No.: 11/967,175

(22) Filed: Dec. 29, 2007

(65) Prior Publication Data

US 2008/0316847 A1  Dec. 25, 2008

(30) Foreign Application Priority Data

Jun. 25, 2007   (TW) ............................... 96122878 A

(51) Int. Cl.
*G11C 7/02* (2006.01)
(52) U.S. Cl. ....................................... 365/207; 365/208
(58) Field of Classification Search .................. 365/207, 365/208, 210.1, 163
See application file for complete search history.

(56) References Cited

U.S. PATENT DOCUMENTS

| | | | |
|---|---|---|---|
| 5,694,363 A | * | 12/1997 | Calligaro et al. ............ 365/190 |
| 5,787,042 A | | 7/1998 | Morgan |
| 5,883,837 A | * | 3/1999 | Calligaro et al. ....... 365/189.15 |
| 7,054,213 B2 | | 5/2006 | Laurent |
| 2006/0221678 A1 | * | 10/2006 | Bedeschi et al. ............ 365/163 |
| 2007/0002654 A1 | * | 1/2007 | Borromeo et al. ........... 365/207 |

FOREIGN PATENT DOCUMENTS

CN   1455412 A   11/2003

* cited by examiner

*Primary Examiner*—Vu A Le

(57) ABSTRACT

A sensing circuit of a phase change memory. The sensing circuit comprises a storage capacitor and a reference capacitor, a storage memory device and a reference memory device, a storage discharge switch and a reference discharge switch, and an arbitrator. First terminals of the storage capacitor and the reference capacitor are respectively coupled to a pre-charge voltage via first switches. First terminals of the storage memory device and the reference memory device are respectively coupled to the first terminals of the storage capacitor and the reference capacitor. The storage discharge switch and the reference discharge switch are respectively coupled to second terminals of the storage memory device and the reference memory device. The arbitrator is coupled to the first terminals of the storage memory device and the reference memory device and provides an output as a read result of the storage memory device.

10 Claims, 7 Drawing Sheets

US 7,796,454 B2

SENSING CIRCUIT OF A PHASE CHANGE MEMORY AND SENSING METHOD THEREOF

BACKGROUND OF THE INVENTION

1. Field of the Invention

The invention relates to a phase change memory and, in particular, to a sensing circuit of a phase change memory.

2. Description of the Related Art

FIG. 1 is a conventional sensing circuit of a phase change memory. In FIG. 1, a current $I_R$ flows through a phase change memory cell 115. Since resistance of the phase change memory cell 115 changes with a storage state thereof, a voltage drop generated across the phase change memory cell 115 by the current $I_R$ also changes. The voltage drop is transferred to a compartor 130 and compared with a reference voltage $V_{REF}$ such that a storage state of the phase change memory 115 is detected. Generally, the comparator 130 is an analog circuit which is designed to detect small differences. Since RC loading of a bit line delays the process of converting a current to a voltage, reading speed is slowed down.

FIG. 2 is a sensing circuit of a phase change memory disclosed in U.S. Pat. No. 5,787,042. In FIG. 2, data bit lines is pre-charged to Vdd/2 and an equalizer is then disconnected. Voltages of the data bit lines migrate to opposite directions from the pre-charge voltage and a logic value of data is read out. Since the sensing circuit therein is a latch, two input terminals thereof are coupled to the complementary bit lines and receive differential signals to provide an adequate sensing margin. As a result, two memory cells are required to store a data bit and area required is twice that of a memory array which only requires a single memory cell to store a data bit.

BRIEF SUMMARY OF THE INVENTION

An embodiment of a sensing circuit of a phase change memory comprises a storage capacitor and a reference capacitor, a storage memory device and a reference memory device, a storage discharge switch and a reference discharge switch, and an arbitrator. First terminals of the storage capacitor and the reference capacitor are respectively coupled to a pre-charge voltage via first switches. First terminals of the storage memory device and the reference memory device are respectively coupled to the first terminals of the storage capacitor and the reference capacitor. The storage discharge switch and the reference discharge switch are respectively coupled to second terminals of the storage memory device and the reference memory device. The arbitrator is coupled to the first terminals of the storage memory device and the reference memory device and provides an output as a read result of the storage memory device.

An embodiment of a sensing method for a phase change memory comprises charging or discharging a storage capacitor and a reference capacitor, discharging or charging the storage capacitor and the reference capacitor via a storage memory device and a reference memory device, and detecting voltage transition points of the storage memory device and the reference memory device and determining a storage state of the storage memory device according to the voltage transition points with an arbitrator.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is the best-contemplated mode of carrying out the invention. This description is made for the purpose of illustrating the general principles of the invention and should not be taken in a limiting sense. The scope of the invention is best determined by reference to the appended claims.

Figure 1:
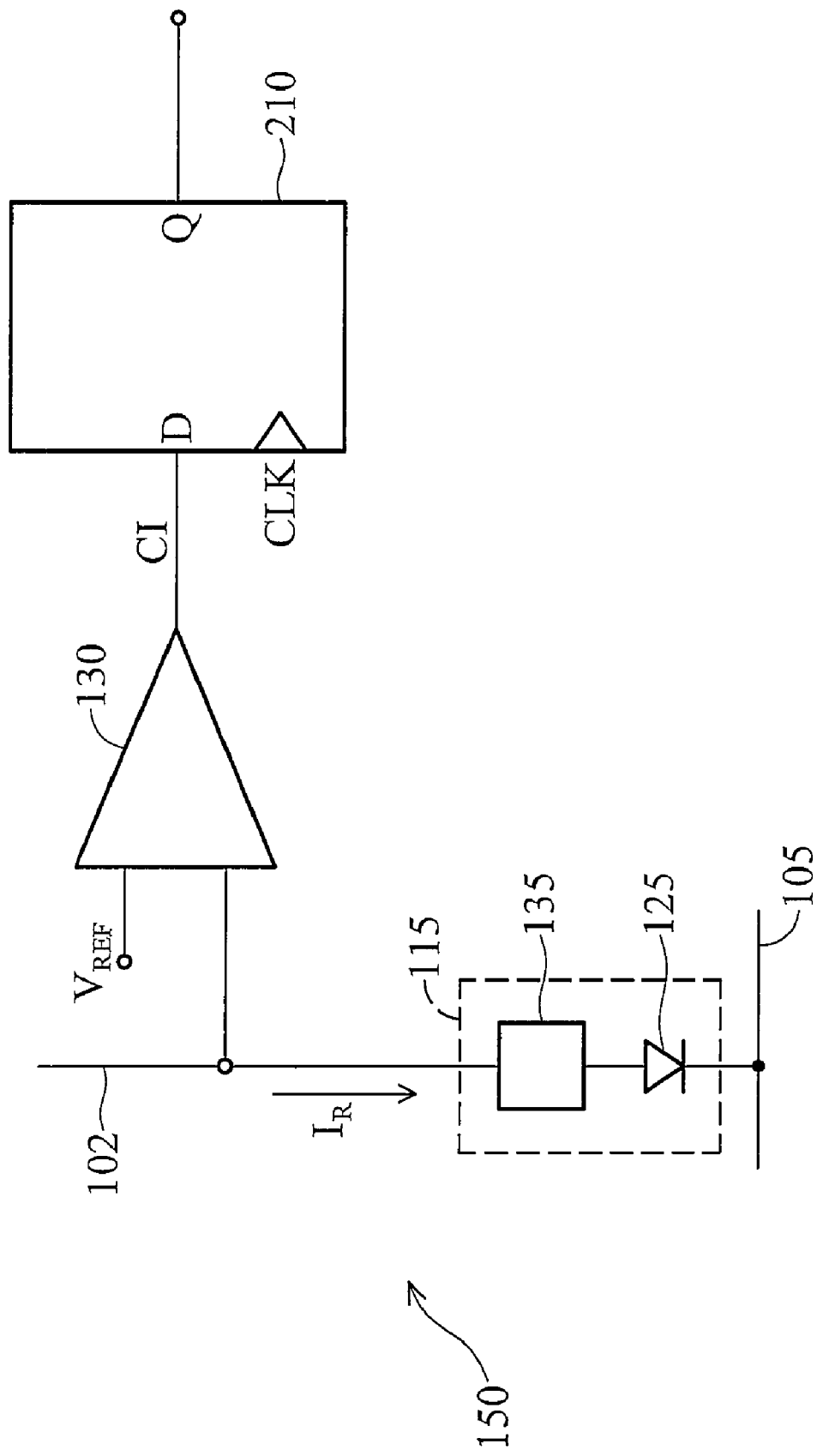
FIG. 1 is a conventional sensing circuit of a phase change memory.
Figure 2:
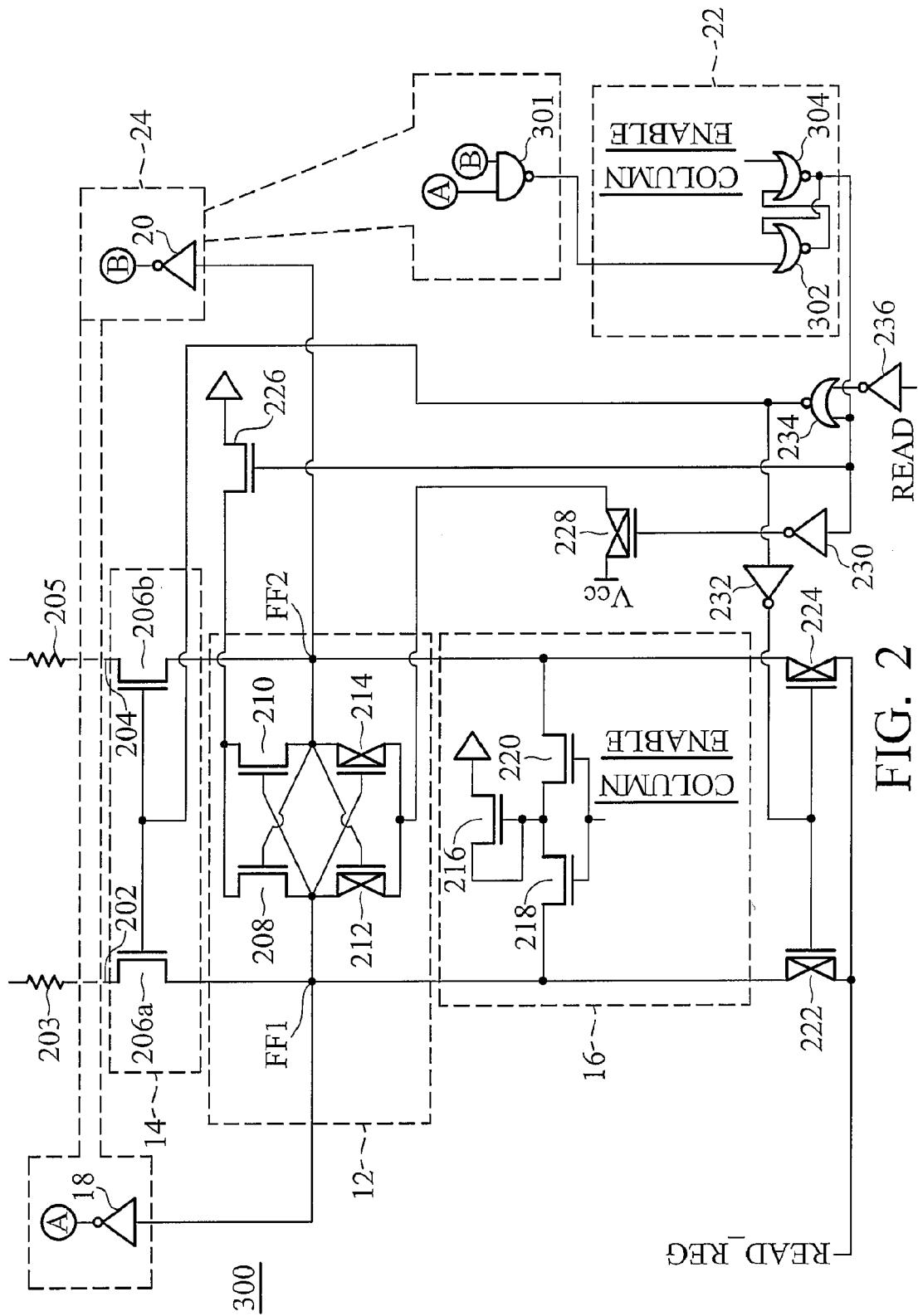
FIG. 2 is a sensing circuit of a phase change memory disclosed in U.S. Pat. No. 5,787,042.
Figure 3A:
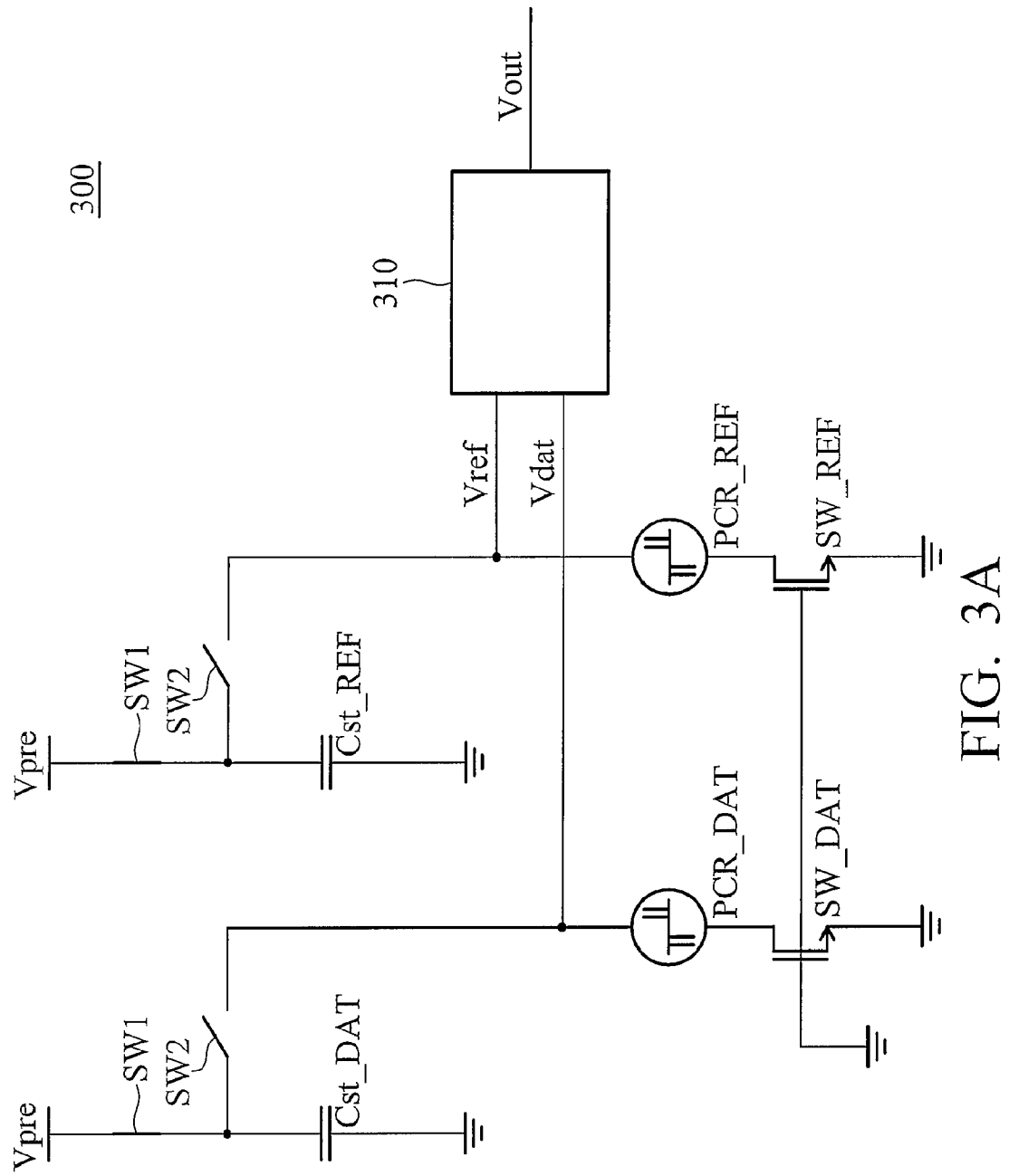
FIGS. 3A and 3B are circuit diagrams of a sensing circuit of a phase change memory according to an embodiment of the invention.
Figure 3B:
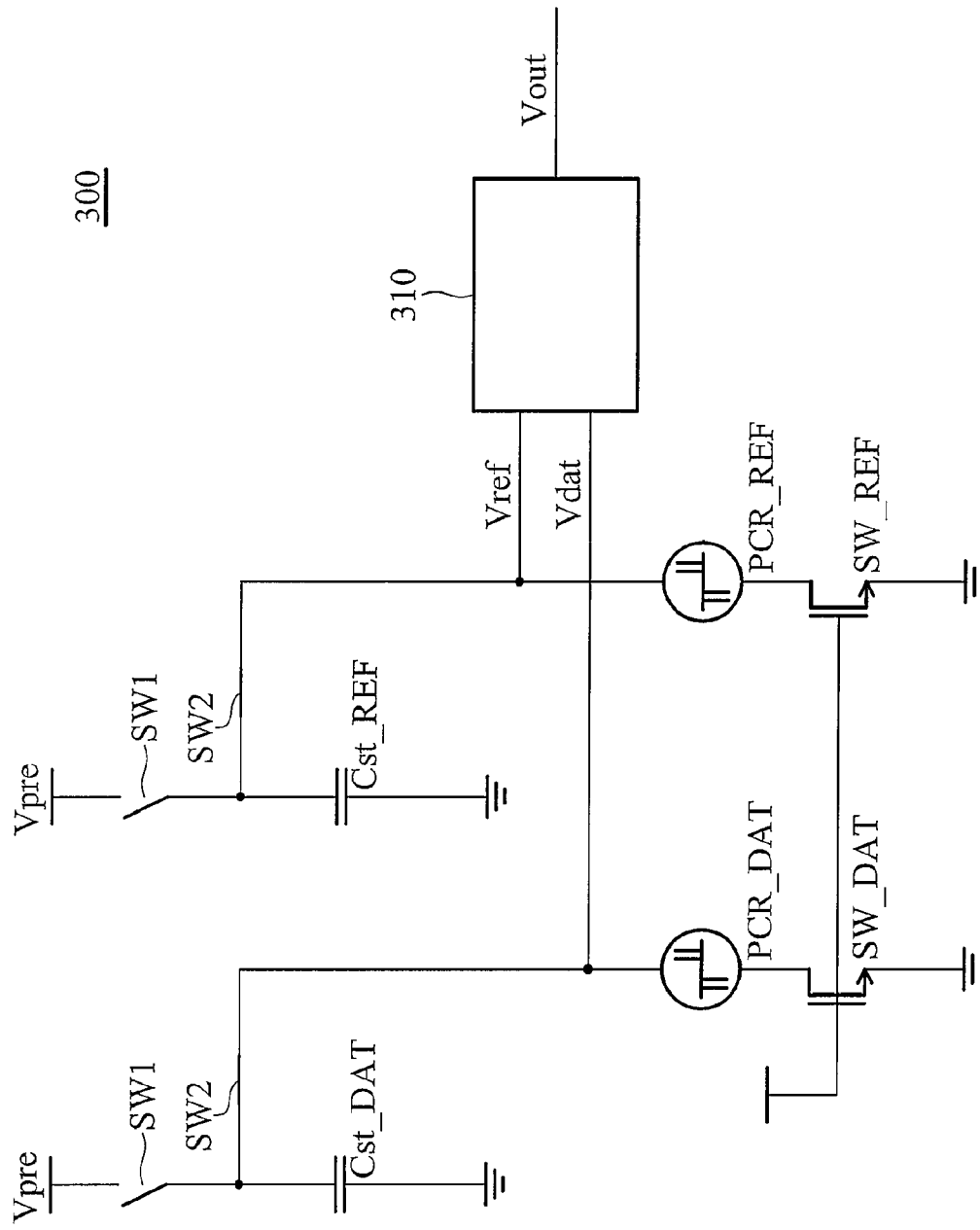

FIGS. 3A and 3B are circuit diagrams of a sensing circuit of a phase change memory according to an embodiment of the invention. The sensing circuit 300 comprises a storage capacitor Cst_DAT and a reference capacitor Cst_REF, a storage memory device PCR_DAT and a reference memory device PCR_REF, a storage discharge switch SW_DAT and a reference discharge switch SW_REF, and an arbitrator 310. First terminals of the storage capacitor Cst_DAT and the reference capacitor Cst_REF are respectively coupled to a pre-charge voltage Vpre via first switches SW1. First terminals of the storage memory device PCR_DAT and the reference memory device PCR_REF are respectively coupled to the first terminals of the storage capacitor Cst_DAT and the reference capacitor Cst_REF via second switched SW2. More specifically, the storage memory device PCR_DAT and the reference memory device PCR_REF are phase change memory devices. The storage discharge switch SW_DAT and the reference discharge switch SW_REF are respectively coupled to second terminals of the storage memory device PCR_DAT and the reference memory device PCR_REF. The arbitrator 310 is coupled to the first terminals of the storage memory device PCR_DAT and the reference memory device PCR_REF and provides an output signal Vout as a read result of the storage memory device PCR_DAT. Preferably, the arbitrator 310 is a digital circuit.

Operation of the sensing circuits 300 in FIGS. 3A and 3B are divided into two stages. The first stage is a pre-charge stage, as shown in FIG. 3A. During the pre-charge stage, the first switches SW1 are closed, the second switches SW2 are open, and storage discharge switch SW_DAT and the reference discharge switch SW_REF are open. Meanwhile, the storage capacitor Cst_DAT and the reference capacitor Cst_REF are connected between the pre-charge voltage Vpre and ground and thus charged. The second stage is a differentiation stage, as shown in FIG. 3B. During the differentiation stage, the first switches SW1 are open, the second switches SW2 are closed, and storage discharge switch SW_DAT and the reference discharge switch SW_REF are closed. Meanwhile, the storage capacitor Cst_DAT and the reference capacitor Cst_REF are discharged via the storage memory device PCR_DAT and the reference memory device PCR_REF. Since resistance of a phase change memory device changes, differs in different storage states, discharging speed of the storage capacitor Cst_DAT and the reference capacitor Cst_REF differs due to resistance difference thereof (determined by storage stages thereof). In other words, transition point of voltage level Vdat and Vref of the first terminals of the storage capacitor Cst_DAT and the reference capacitor Cst_REF from high to low voltage levels differs. The arbitrator 310 detects the transition points of the voltage level Vdat and Vref such that a storage state of the storage memory device PCR_DAT is determined.

Figure 3C:
FIG. 3C is a schematic diagram of an embodiment of the arbitrator in FIGS. 3A and 3B.

More specifically, the arbitrator 310 is a SR latch, as shown in FIG. 3C and a truth table thereof is listed as follow,

| R | S | Q | Qb |
|---|---|---|---|
| 1 | 1 | 0 | 0 |
| 1 | 0 | 0 | 1 |
| 0 | 1 | 1 | 0 |
| 0 | 0 | No change | No change |

When logic states of Vdat and Vref are both 1, an output logic state of Vout is 0. When logic states of Vdat and Vref are respectively 0 and 1, an output logic state of Vout is 0. When logic states of Vdat and Vref are respectively 1 and 0, an output logic state of Vout is 1. When logic states of Vdat and Vref are both 0, an output logic state of Vout remains in a previous output logic state.

Figure 3D:
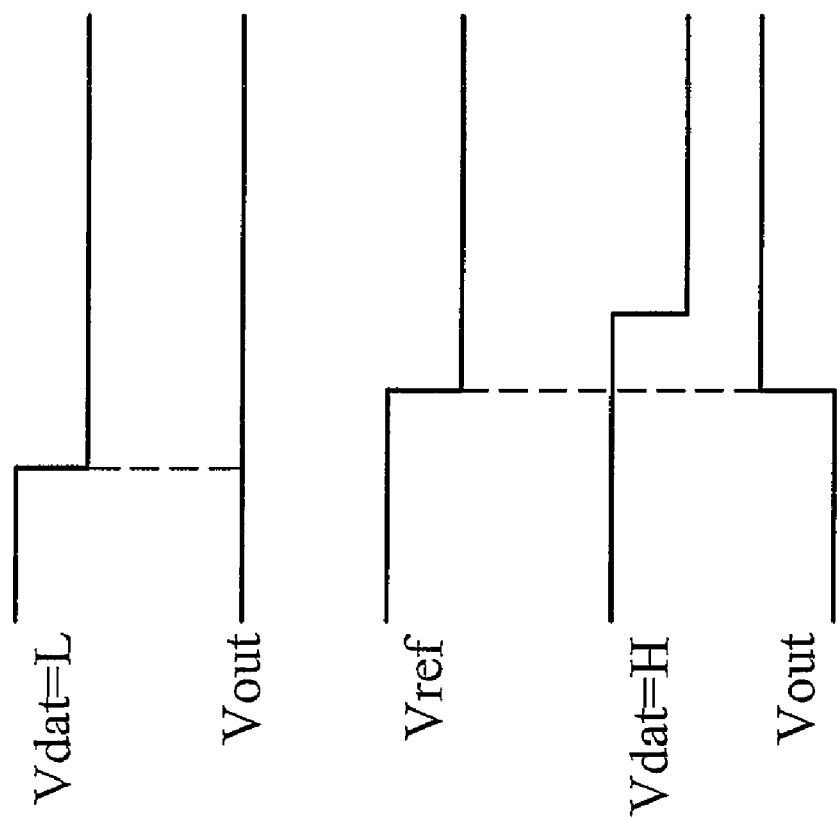
FIG. 3D is a schematic diagram of an output state of the SR latch in FIG. 3C under different logic states of Vdat and Vref.
Figure 4:
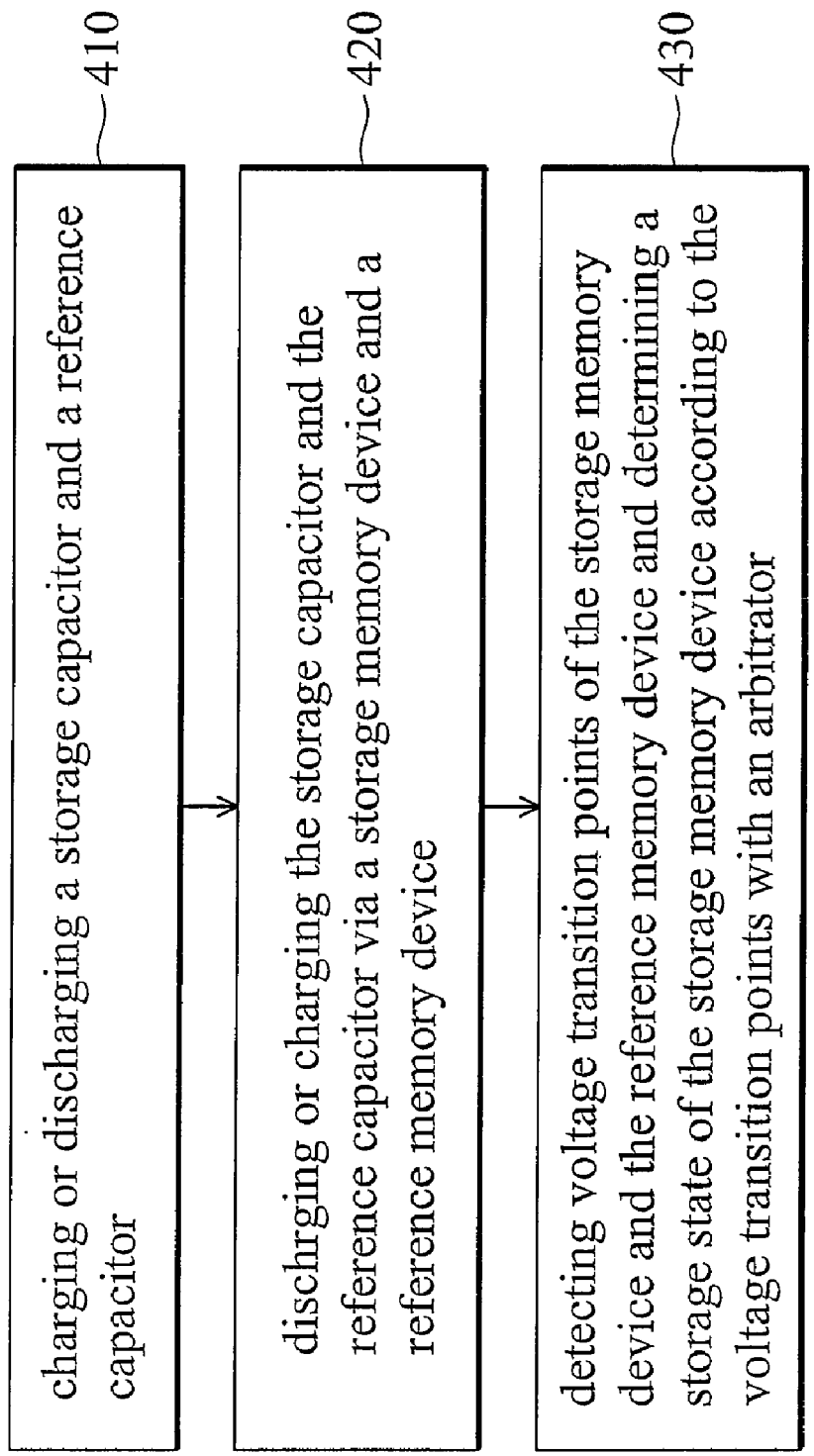
FIG. 4 is a flow chart of a sensing method for a phase change memory according to an embodiment of the invention.

FIG. 3D is a schematic diagram of an output state of the SR latch in FIG. 3C under different logic states of Vdat and Vref. No matter which logic state the storage state of the storage memory device PCR_DAT is at, state and resistance of the reference memory device PCR_REF is fixed. As a result, transition point of Vref is fixed. When the storage memory device PCR_DAT is in a low resistance state, a discharge current of the storage capacitor Cst_DAT is higher and transition point of Vdat is thus earlier. When Vdat transitions, a logic state Vout of the SR latch is 0, accordingly, logic states of Vdat and Vref are respectively 0 and 1. Accordingly, it is known that the storage memory device PCR_DAT is in a low resistance state. When the storage memory device PCR_DAT is in a high resistance state, a discharge current of the storage capacitor Cst_DAT is lower and transition point of Vdat is thus later. When Vdat transitions, a logic state Vout of the SR latch is 1, accordingly, logic states of Vdat and Vref are respectively 1 and 0. It is known that the storage memory device PCR_DAT is in a high resistance state FIG. 4 is a flow chart of a sensing method for a phase change memory according to an embodiment of the invention. The sensing method comprises charging or discharging a storage capacitor and a reference capacitor (step 410), discharging or charging the storage capacitor and the reference capacitor via a storage memory device and a reference memory device (step 420), and detecting voltage transition points of the storage memory device and the reference memory device and determining a storage state of the storage memory device according to the voltage transition points with an arbitrator (step 430).

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. A sensing circuit of a phase change memory, comprising:
  a storage capacitor and a reference capacitor having first terminals respectively coupled to a pre-charge voltage via first switches;
  a storage memory device and a reference memory device having first terminals respectively coupled to the first terminals of the storage capacitor and the reference capacitor via second switches;
  a storage discharge switch and a reference discharge switch respectively coupled to second terminals of the storage memory device and the reference memory device; and
  an arbitrator coupled to the first terminals of the storage memory device and the reference memory device and providing an output signal as a read result of the storage memory device.

2. The sensing circuit of a phase change memory as claimed in claim 1, wherein the storage memory device and the reference memory device are phase change memory devices.

3. The sensing circuit of a phase change memory as claimed in claim 1, wherein the arbitrator is a digital circuit.

4. The sensing circuit of a phase change memory as claimed in claim 3, wherein the digital circuit is an SR-latch.

5. The sensing circuit of a phase change memory as claimed in claim 1, wherein the storage discharge switch and the reference discharge switch are MOS transistors, BJTs, or diodes.

6. The sensing circuit of a phase change memory as claimed in claim 1, wherein the first switches are closed, the second switches are open, and the storage discharge switch and the reference discharge switch are open during a first stage of reading the storage memory device.

7. The sensing circuit of a phase change memory as claimed in claim 1, wherein the first switches are open, the second switches are closed, and the storage discharge switch and the reference discharge switch are closed during a second stage of reading the storage memory device.

8. The sensing circuit of a phase change memory as claimed in claim 1, wherein the second terminals of the storage capacitor and the reference capacitor are grounded.

9. A sensing method of a phase change memory, comprising:
  charging or discharging a storage capacitor and a reference capacitor;
  discharging or charging the storage capacitor and the reference capacitor via a storage memory device and a reference memory device; and
  detecting voltage transition points of the storage memory device and the reference memory device and determining a storage state of the storage memory device according to the voltage transition points with an arbitrator,
  wherein the arbitrator is a digital circuit and the digital circuit is an SR-latch.

10. The sensing method of a phase change memory as claimed in claim 9, wherein the storage memory device and the reference memory device are phase change memory devices.

* * * * *